(12) United States Patent
Polet et al.

(10) Patent No.: US 12,072,636 B2
(45) Date of Patent: Aug. 27, 2024

(54) FLUID HANDLING SYSTEM AND LITHOGRAPHIC APPARATUS

(71) Applicant: ASML NETHERLANDS B.V., Veldhoven (NL)

(72) Inventors: Theodorus Wilhelmus Polet, Geldrop (NL); Koen Steffens, Veldhoven (NL); Ronald Van Der Ham, Maarheeze (NL); Gerben Pieterse, Maarheeze (NL); Erik Henricus Egidius Catharina Eummelen, Veldhoven (NL); Francis Fahrni, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/641,206

(22) PCT Filed: Aug. 26, 2020

(86) PCT No.: PCT/EP2020/073867
§ 371 (c)(1),
(2) Date: Mar. 8, 2022

(87) PCT Pub. No.: WO2021/047911
PCT Pub. Date: Mar. 18, 2021

(65) Prior Publication Data
US 2024/0192607 A1    Jun. 13, 2024

(30) Foreign Application Priority Data

Sep. 13, 2019  (EP) ..................................... 19197225

(51) Int. Cl.
*G03F 7/00*  (2006.01)
*G03F 7/20*  (2006.01)

(52) U.S. Cl.
CPC ........ *G03F 7/70341* (2013.01); *G03F 7/2041* (2013.01); *G03F 7/70733* (2013.01); *G03F 7/70991* (2013.01)

(58) Field of Classification Search
CPC ........................... G03F 7/70341; G03F 7/2041
See application file for complete search history.

(56) References Cited

U.S. PATENT DOCUMENTS 6,952,253 B2   10/2005   Lof et al.
8,760,616 B2    6/2014   Kaneko et al.
(Continued)

FOREIGN PATENT DOCUMENTS

CN    101021693    8/2007
CN    101403862    4/2009
(Continued)

OTHER PUBLICATIONS

International Search Report dated Dec. 8, 2020, issued in corresponding International Patent Application No. PCT/EP2020/073867 (3 pgs.).

(Continued)

*Primary Examiner* — Steven Whitesell Gordon
(74) *Attorney, Agent, or Firm* — Pillsbury Winthrop Shaw Pittman, LLP

(57) ABSTRACT

A fluid handling system for wetting a substrate irradiated by radiation. The fluid handling system include a first device to confine a first liquid to a first space between the first device and the substrate. The first device includes a first liquid supply member to provide the first liquid to the first space and an extraction member to remove liquid. The fluid handling system further includes a second device including a second liquid supply member to provide a second liquid to a second space between the second device and the substrate, wherein there is a gap on the surface of the substrate (Continued)

Figure 2A:
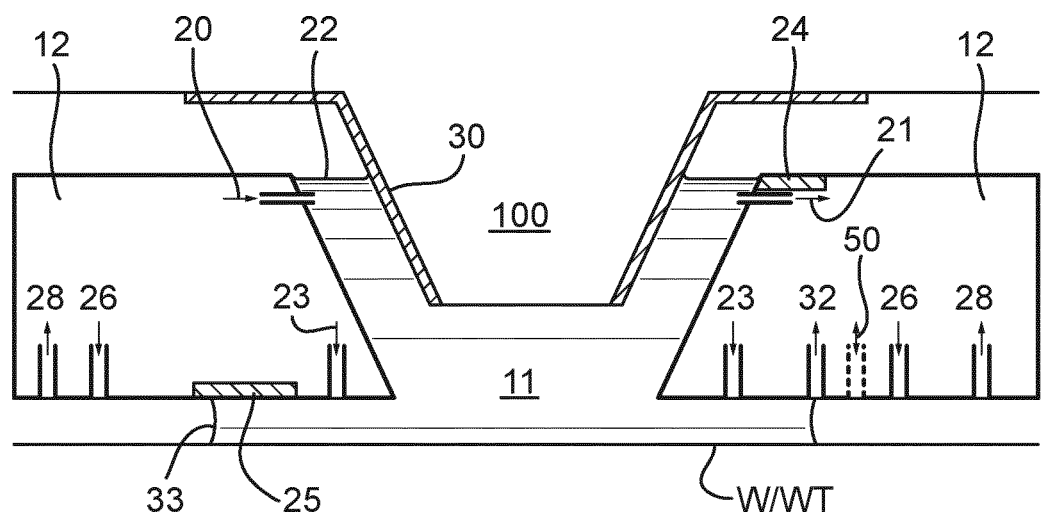

between the first and second liquids. The fluid handling system is configured to provide the second liquid to the second space without removing any liquid from the second space to form a liquid layer, and is configured to provide the first and second liquids on the substrate simultaneously.

20 Claims, 10 Drawing Sheets

(56) References Cited

U.S. PATENT DOCUMENTS

| | | | |
|---|---|---|---|
| 2005/0094114 A1* | 5/2005 | Streefkerk | G03F 7/70341 355/53 |
| 2005/0134815 A1* | 6/2005 | Van Santen | G03F 7/7085 355/72 |
| 2006/0119809 A1* | 6/2006 | Verhagen | G03F 7/70808 355/53 |
| 2006/0250593 A1 | 11/2006 | Nishii | |
| 2007/0159613 A1 | 7/2007 | Baselmans et al. | |
| 2007/0188725 A1 | 8/2007 | Sakai | |
| 2007/0296939 A1 | 12/2007 | Nishii | |
| 2008/0002169 A1 | 1/2008 | Hasegawa et al. | |
| 2008/0106710 A1* | 5/2008 | Lin | G03B 27/52 355/30 |
| 2009/0073395 A1 | 3/2009 | Berkvens et al. | |
| 2009/0122283 A1 | 5/2009 | Hasegawa | |
| 2009/0262316 A1 | 10/2009 | Kohno et al. | |
| 2009/0279058 A1 | 11/2009 | Hasegawa | |
| 2010/0060868 A1 | 3/2010 | Tanasa et al. | |
| 2010/0097584 A1 | 4/2010 | Doguchi | |
| 2010/0097585 A1 | 4/2010 | Poon et al. | |
| 2010/0304310 A1 | 12/2010 | Sato | |
| 2011/0134400 A1 | 6/2011 | Shibazaki | |
| 2012/0062860 A1 | 3/2012 | Chonan | |
| 2012/0162619 A1* | 6/2012 | Sato | G03F 7/70216 355/77 |
| 2012/0188521 A1* | 7/2012 | Sato | G03F 7/70925 355/30 |
| 2013/0050666 A1 | 2/2013 | Nagasaki | |
| 2013/0059253 A1 | 3/2013 | Nagasaka | |
| 2013/0135594 A1 | 5/2013 | Sato | |
| 2013/0169944 A1* | 7/2013 | Nishii | G03F 7/70341 355/30 |

FOREIGN PATENT DOCUMENTS

| | | |
|---|---|---|
| CN | 107991843 | 5/2018 |
| JP | 2007-053193 | 3/2007 |
| JP | 2010-123615 | 6/2010 |
| JP | 2010-278299 | 12/2010 |
| JP | 2011-014708 | 1/2011 |
| JP | 2011-018744 | 1/2011 |
| JP | 2014-011201 | 1/2014 |
| JP | 2014-011202 | 1/2014 |
| JP | 2014/175455 | 9/2014 |
| TW | 201129878 | 9/2011 |
| WO | 99/49504 | 9/1999 |
| WO | 2017/054987 | 4/2017 |
| WO | 2018/007119 | 1/2018 |

OTHER PUBLICATIONS

Written Opinion of the International Searching Authority dated Dec. 8, 2020, issued in corresponding International Patent Application No. PCT/EP2020/073867 (6 pgs.).

Communication Pursuant to Article 94(3) EPC dated May 2, 2023, issued in corresponding European Patent Application No. 20765223.1 (9 pgs.).

* cited by examiner

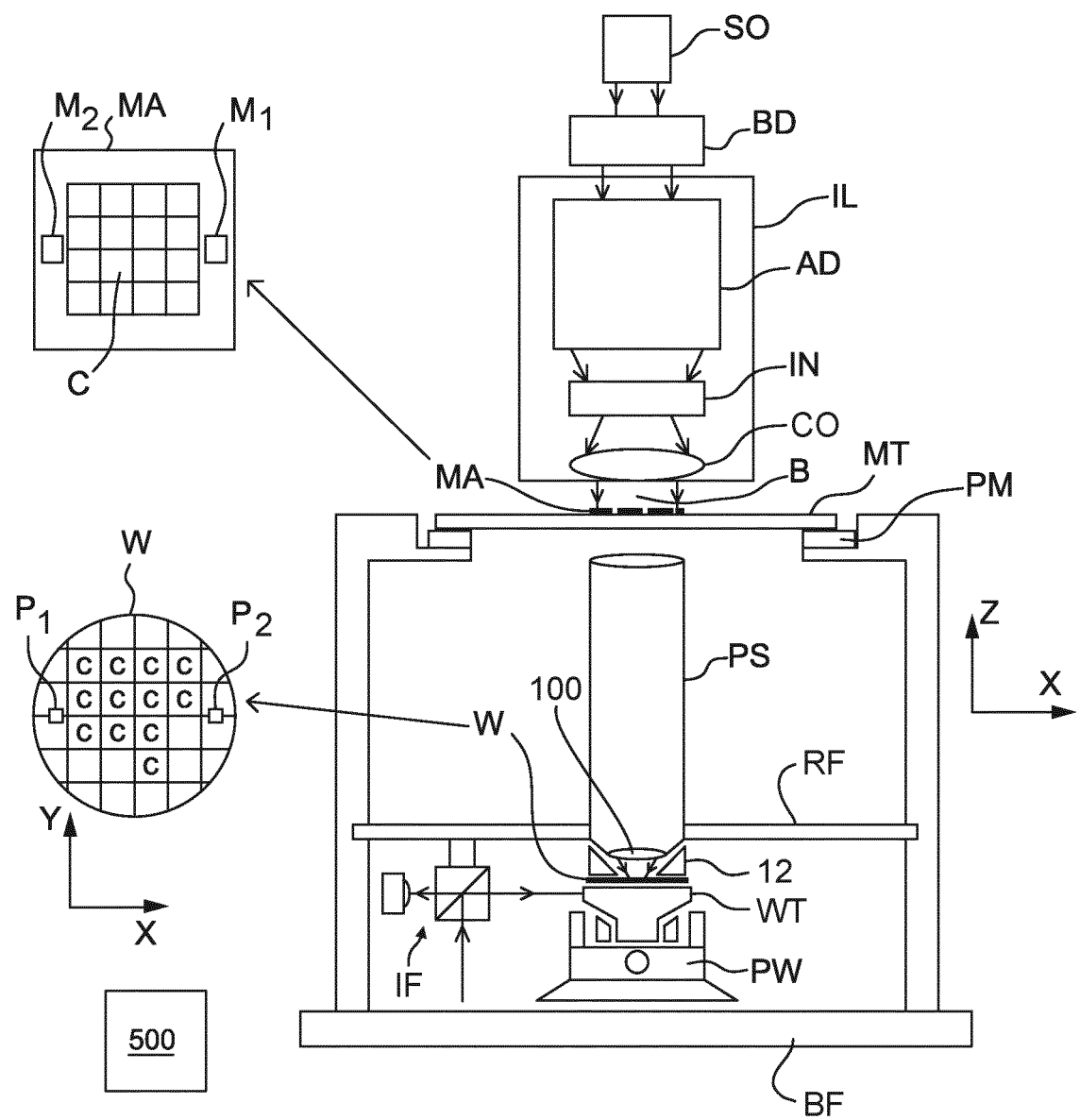

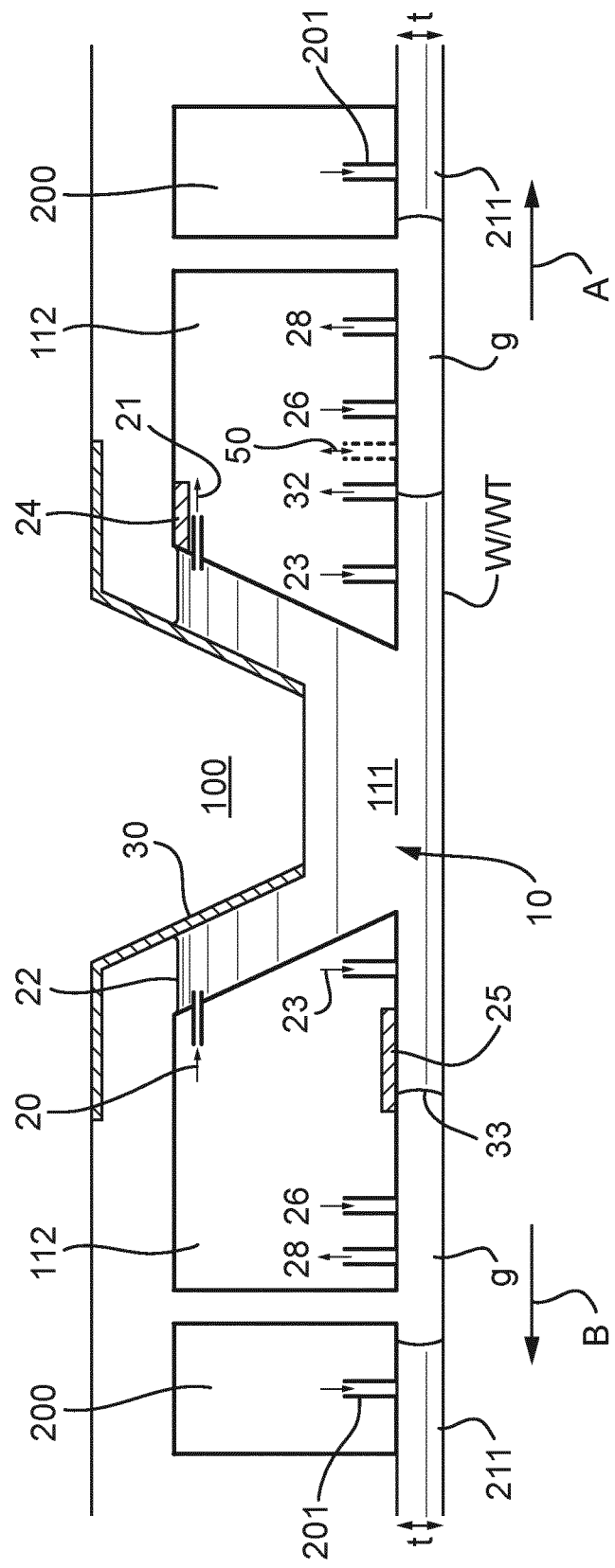

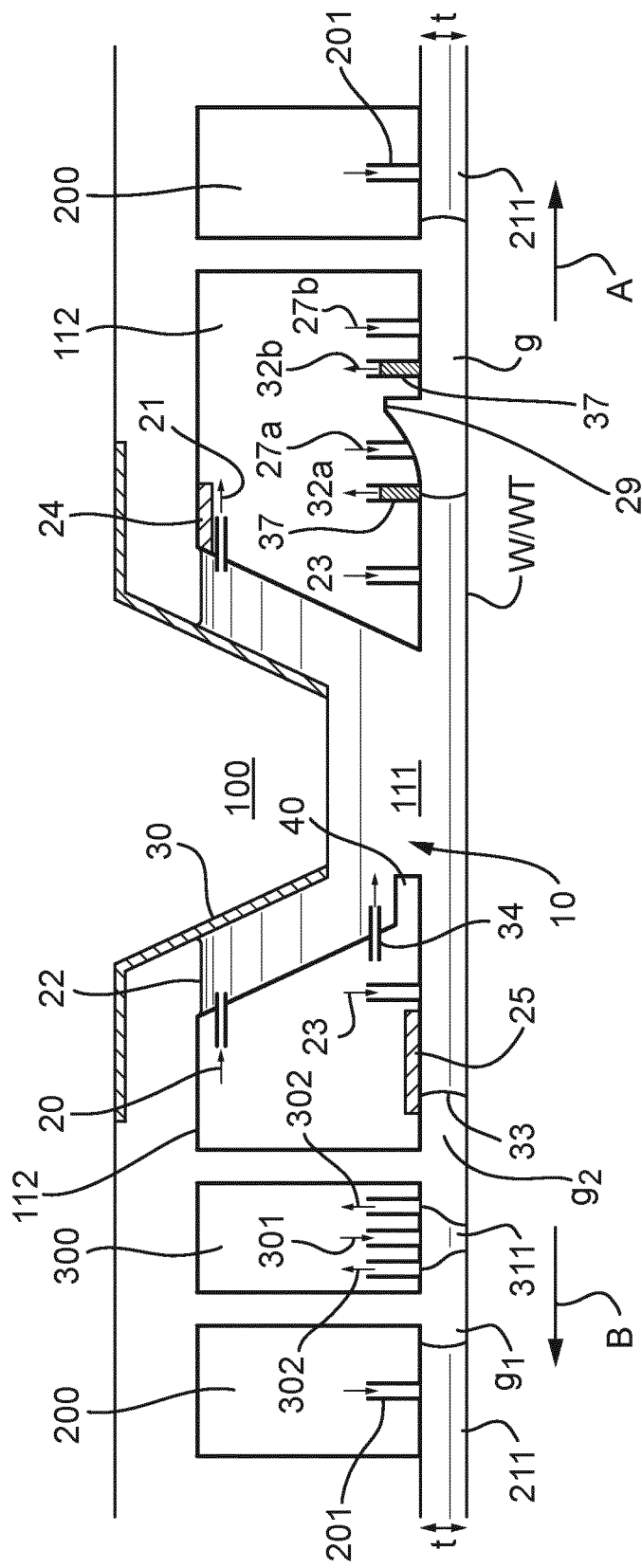

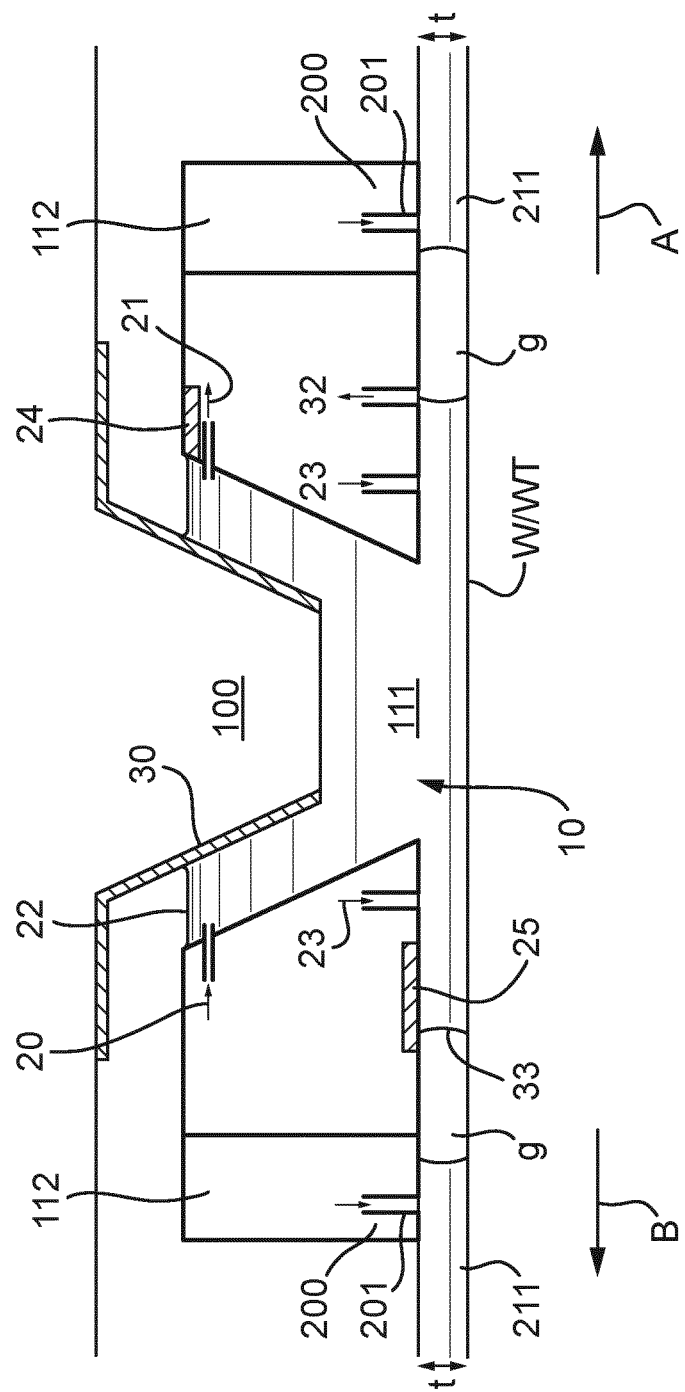

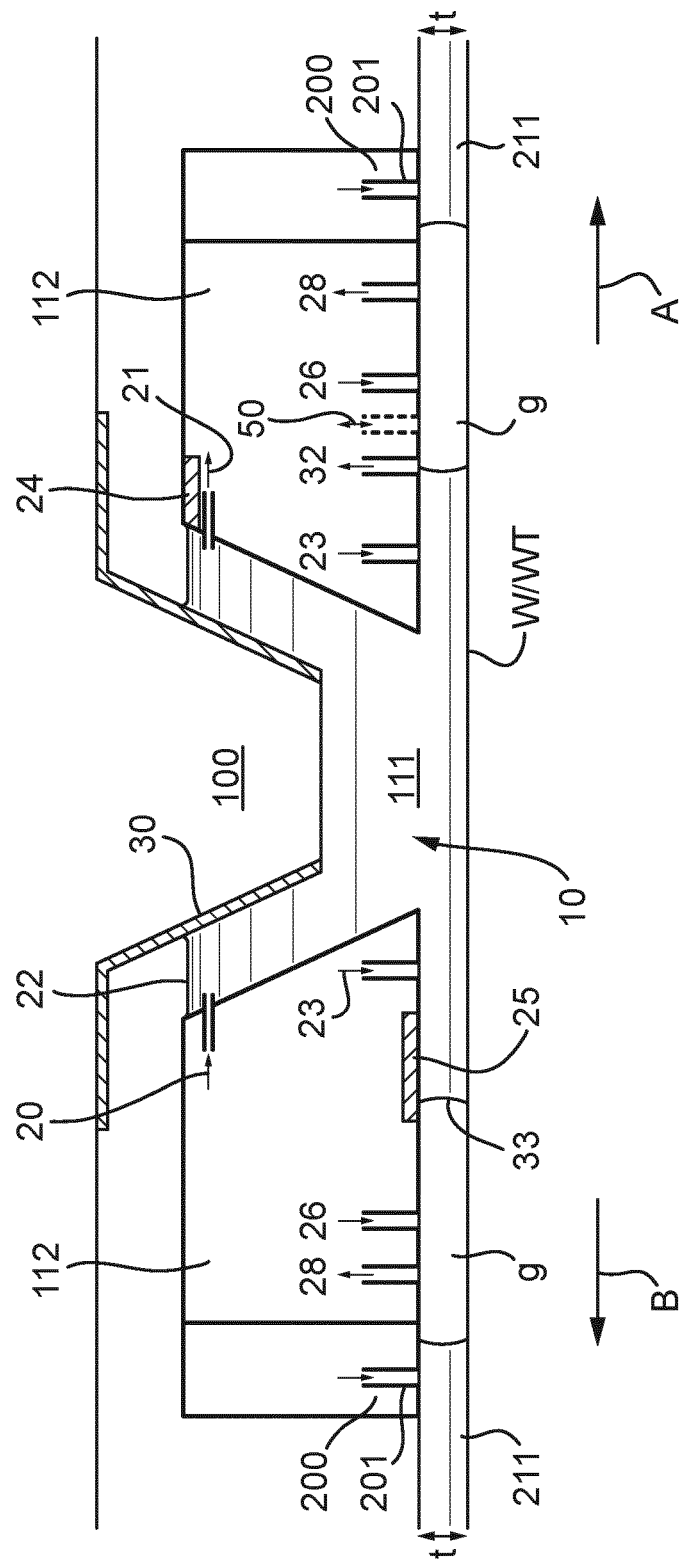

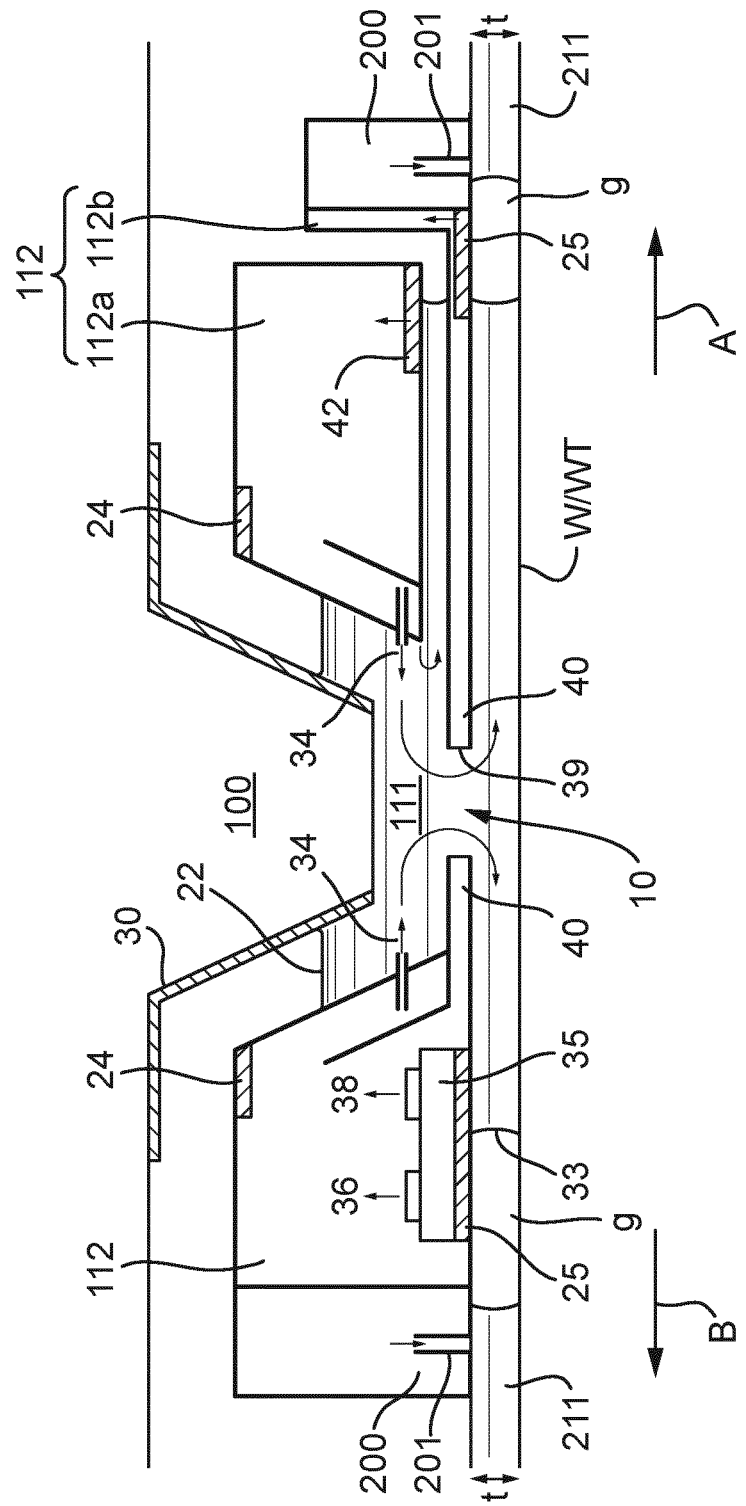

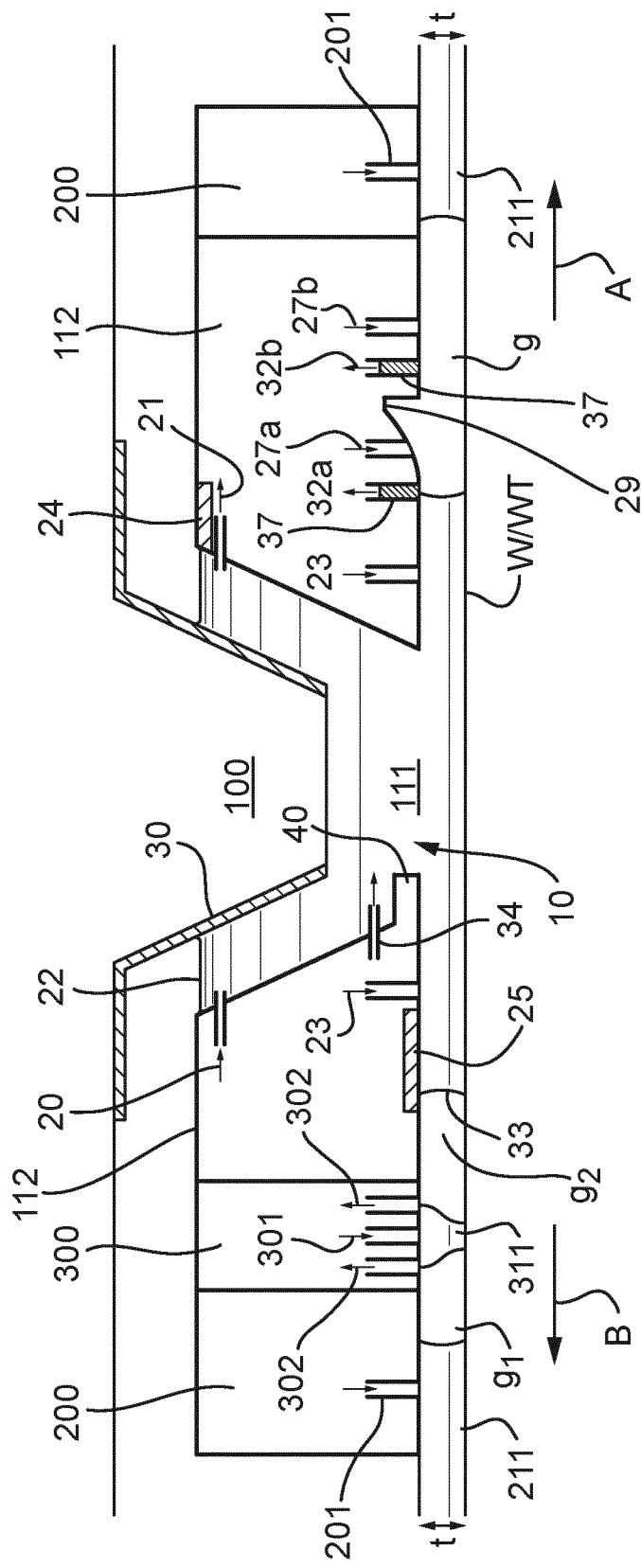

FLUID HANDLING SYSTEM AND LITHOGRAPHIC APPARATUS

CROSS-REFERENCE TO RELATED APPLICATIONS

This application is the U.S. national phase entry of PCT Patent Application No. PCT/EP2020/073867, which was filed on Aug. 26, 2020, which claims priority of European Patent Application No. 19197225.6, which was filed on Sep. 13, 2019 which is incorporated herein its entirety by reference.

FIELD

The present invention relates to a fluid handling system and a method for wetting a substrate. The present invention also relates to the lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer). Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Further improvements in the resolution of smaller features may be achieved by providing an immersion fluid having a relatively high refractive index, such as water, on the substrate during exposure. The effect of the immersion fluid is to enable imaging of smaller features since the exposure radiation will have a shorter wavelength in the fluid than in gas. The effect of the immersion fluid may also be regarded as increasing the effective numerical aperture (NA) of the system and also increasing the depth of focus.

The immersion fluid may be confined to a localized area between the projection system of the lithographic apparatus and the substrate by a fluid handling structure. Fast relative movement between the substrate and the confined immersion liquid may cause leaking of the immersion fluid from the localized area. Such leaking is undesirable and may lead to defects on the substrate. The speed at which the substrate is stepped or scanned with respect to the projection system is thus limited. This limits the throughput of the lithographic apparatus.

SUMMARY

It is an object of the present invention to provide a fluid handling system and method in which measures are taken to increase throughput.

According to the present invention, there is provided a fluid handling system for wetting a region of a surface of a substrate irradiated by a radiation beam, the fluid handling system comprising: a first device configured to confine a first liquid to a first space between at least a part of the first device and the surface of the substrate, the first device having an aperture formed therein for the passage therethrough of the radiation beam to irradiate the region by passing through the first liquid, the first device comprising at least one first liquid supply member configured to provide the first liquid to the first space and at least one extraction member configured to remove liquid from the first space; and a second device comprising at least one second liquid supply member configured to provide a second liquid to a second space between at least a part of the second device and the surface of the substrate, wherein there is a gap on the surface of the substrate between the second liquid and the first liquid, wherein the fluid handling system is configured to provide the second liquid to the second space without removing any liquid from the second space to form a liquid layer over at least the region, and is configured to provide the first liquid and the second liquid on the surface of the substrate simultaneously.

According to the present invention, there is also provided a method of wetting a region of a substrate as herein disclosed.

According to the present invention, there is also provided a lithographic apparatus as herein disclosed.

Further embodiments, features and advantages of the present invention, as well as the structure and operation of the various embodiments, features and advantages of the present invention, are described in detail below with reference to the accompanying drawings.

PRE DESCRIPTION OF THE DRAWINGS

Figure 2B:
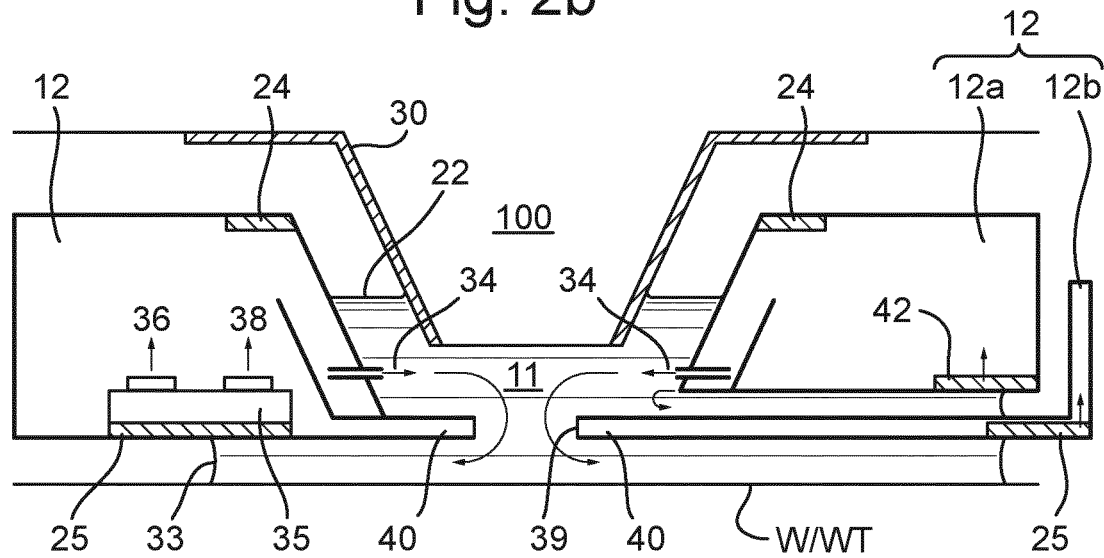
Figure 2C:
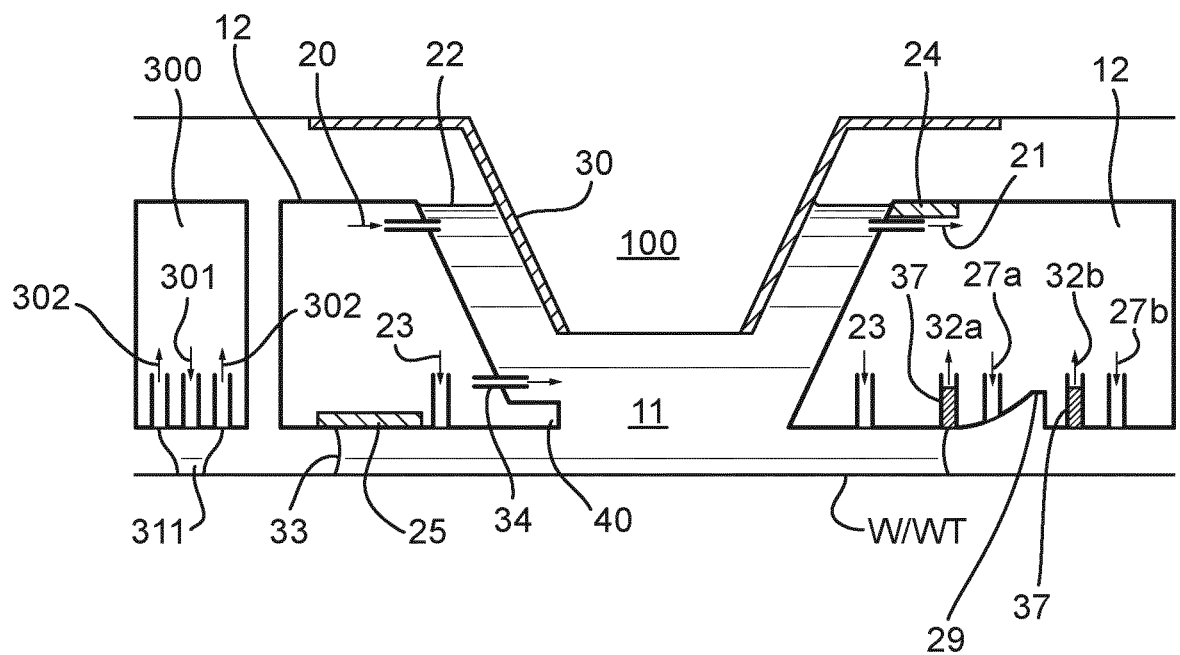
Figure 3B:
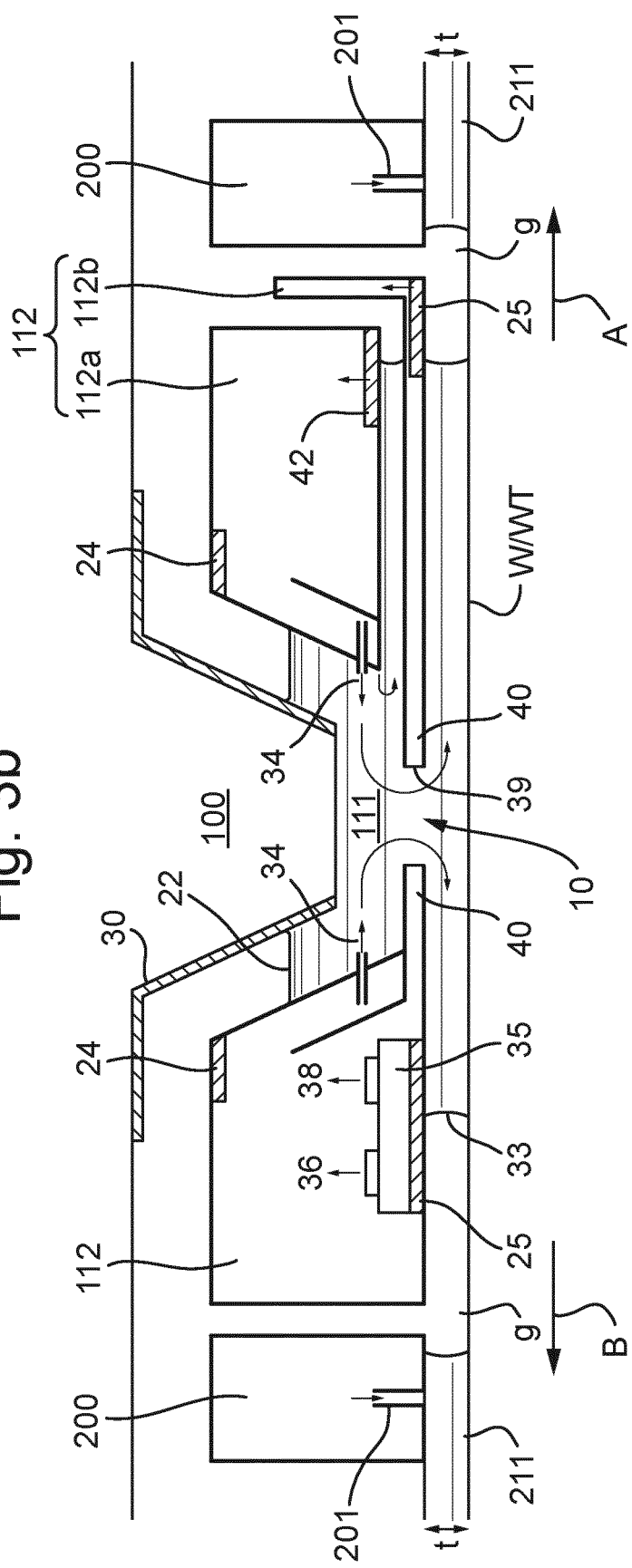

Embodiments of the invention will now be described, by way of example only, with reference to the accompanying schematic drawings, in which corresponding reference symbols indicate corresponding parts, and in which:

FIG. 1 detects the schematic overview of the lithographic apparatus:

FIGS. 2a, 2b and 2c each depict, in cross section, two different versions of a fluid handling system with different features illustrated on the left hand side and the right hand side of each version, which may extend around the complete circumference;

FIGS. 3a, 3b and 3c each depict, in cross section, a system of an embodiment of the present invention with two different versions of a fluid handling system with different features illustrated on the left hand side and the right hand side, which may extend around the complete circumference; and FIGS. 4a, 4b, 4c and 4d each depict, in cross section, a system of an embodiment of the present invention with two different versions of a fluid handling system with different features illustrated on the left hand side and the right hand side, which may extend around the complete circumference.

The features shown in the figures are not necessarily to scale, and the size and/or arrangement depicted is not limiting. It will be understood that the figures include optional features which may not be essential to the invention. Furthermore, not all of the features of the apparatus are depicted in each of the figures, and the figures may only show some of the components relevant for describing a particular feature.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

FIG. 1 schematically depicts a lithographic apparatus. The lithographic apparatus includes an illumination system (also referred to as illuminator) IL configured to condition a radiation beam B (e.g., UV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a substrate table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus is of a type wherein at least a portion of the substrate W may be covered by an immersion liquid having a relatively high refractive index, e.g., water, so as to fill an immersion space 11 between the projection system PS and the substrate W—which is also referred to as immersion lithography. More information on immersion techniques is given in U.S. Pat. No. 6,952,253, which is incorporated herein by reference.

The lithographic apparatus may be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage (not depicted in figures). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Immersion techniques have been introduced into lithographic systems to enable improved resolution of smaller features. In an immersion lithographic apparatus, a liquid layer of immersion liquid having a relatively high refractive index is interposed in the immersion space 11 between a projection system PS of the apparatus (through which the patterned beam is projected towards the substrate W) and the substrate W. The immersion liquid covers at least the part of the substrate W under a final element of the projection system PS. Thus, at least the portion of the substrate W undergoing exposure is immersed in the immersion liquid.

In commercial immersion lithography, the immersion liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space 11 as immersion liquid. Other liquids with a high refractive index can be used besides water as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the immersion space 11 between the final element 100 and a surface facing the final element 100. The facing surface is a surface of substrate W or a surface of the supporting stage (or substrate support WT) that is co-planar with the surface of the substrate W. (Please note that reference in the following text to surface of the substrate W also refers in addition or in the alternative to the surface of the substrate support WT, unless expressly stated otherwise; and vice versa). A fluid handling structure 12 present between the projection system PS and the substrate support WT is used to confine the immersion liquid to the immersion space 11. The immersion space 11 filled by the immersion liquid is smaller in plan than the top surface of the substrate W and the immersion space 11 remains substantially stationary relative to the projection system PS while the substrate W and substrate support WT move underneath.

Other immersion systems have been envisaged such as an unconfined immersion system (a so-called 'All Wet' immersion system) and a bath immersion system. In an unconfined immersion system, the immersion liquid covers more than the surface under the final element 100. The liquid outside the immersion space 11 is present as a thin liquid film. The liquid may cover the whole surface of the substrate W or even the substrate W and the substrate support WT co-planar with the substrate W. In a bath type system, the substrate W is fully immersed in a bath of immersion liquid.

The fluid handling structure 12 is a structure which supplies the immersion liquid to the immersion space 11, removes the immersion liquid from the immersion space 11 and thereby confines the immersion liquid to the immersion space 11. It includes features which are a part of a fluid supply system. The arrangement disclosed in PCT patent application publication no. WO 99/49504 is an early fluid handling structure comprising pipes which either supply or recover the immersion liquid from the immersion space 11 and which operate depending on the relative motion of the stage beneath the projection system PS. In more recent designs, the fluid handling structure extends along at least a part of a boundary of the immersion space 11 between the final element 100 of the projection system PS and the substrate support WT or substrate W, so as to in part define the immersion space 11.

The fluid handing structure 12 may have a selection of different functions. Each function may be derived from a corresponding feature that enables the fluid handling structure 12 to achieve that function. The fluid handling structure 12 may be referred to by a number of different terms, each referring to a function, such as barrier member, seal member, fluid supply system, fluid removal system, liquid confinement structure, etc.

As a barrier member, the fluid handling structure 12 is a barrier to the flow of the immersion liquid from the immersion space 11. As a liquid confinement structure, the structure confines the immersion liquid to the immersion space 11. As a seal member, sealing features of the fluid handling structure 12 form a seal to confine the immersion liquid to the immersion space 11. The sealing features may include an additional gas flow from an opening in the surface of the seal member, such as a gas knife.

In an embodiment the fluid handling structure 12 may supply immersion fluid and therefore be a fluid supply system.

In an embodiment the fluid handling structure 12 may at least partly confine immersion fluid and thereby be a fluid confinement system.

In an embodiment the fluid handling structure 12 may provide a barrier to immersion fluid and thereby be a barrier member, such as a fluid confinement structure.

In an embodiment the fluid handling structure 12 may create or use a flow of gas, for example to help in controlling the flow and/or the position of the immersion fluid.

The flow of gas may form a seal to confine the immersion fluid so the fluid handling structure 12 may be referred to as a seal member; such a seal member may be a fluid confinement structure.

In an embodiment, immersion liquid is used as the immersion fluid. In that case the fluid handling structure 12 may be a liquid handling system. In reference to the aforementioned description, reference in this paragraph to a feature defined with respect to fluid may be understood to include a feature defined with respect to liquid.

A lithographic apparatus has a projection system PS. During exposure of a substrate W, the projection system PS projects a beam of patterned radiation onto the substrate W. To reach the substrate W, the path of the radiation beam B passes from the projection system PS through the immersion liquid confined by the fluid handling structure 12 between the projection system PS and the substrate W. The projection system PS has a lens element, the last in the path of the beam, which is in contact with the immersion liquid. This lens element which is in contact with the immersion liquid may be referred to as 'the last lens element' or "the final element". The final element 100 is at least partly surrounded by the fluid handling structure 12. The fluid handling structure 12 may confine the immersion liquid under the final element 100 and above the facing surface.

FIGS. 2a, 2b and 2c show different features which may be present in variations of a fluid handling system. The designs may share some of the same features as FIGS. 2a, 2b and 2c unless described differently. The features described herein may be selected individually or in combination as shown or as required. The figures depict different versions of a fluid handling system with different features illustrated on the left hand side and the right hand side, which may extend around the complete circumference. Thus, for example, the fluid handling system may have the same features extending around the complete circumference. For example, the fluid handling system may have only the features of the left hand side of FIG. 2a, or the right hand side of FIG. 2a, or the left hand side of FIG. 2b, or the right hand side of FIG. 2b, or the left hand side of 2c, or the right hand side of 2c. Alternatively, the fluid handling system may be provided with any combination of features from these figures at different locations around the circumference. The fluid handling system may comprise the fluid handling structure 12 as described in the variations below.

FIG. 2a shows a fluid handling structure 12 around the bottom surface of the final element 100. The final element 100 has an inverted frusto-conical shape. The frusto-conical shape having a planar bottom surface and a conical surface. The frusto-conical shape protrudes from a planar surface and having a bottom planar surface. The bottom planar surface is the optically active portion of the bottom surface of the final element 100, through which the radiation beam B may pass. The final element 100 may have a coating 30. The fluid handling structure 12 surrounds at least part of the frusto-conical shape. The fluid handling structure 12 has an inner-surface which faces towards the conical surface of the frusto-conical shape. The inner-surface and the conical surface may have complementary shapes. A top surface of the fluid handling structure 12 may be substantially planar. The fluid handling structure 12 may fit around the frusto-conical shape of the final element 100. A bottom surface of the fluid handling structure 12 may be substantially planar and in use the bottom surface may be parallel with the facing surface of the substrate support WT and/or substrate W. Thus, the bottom surface of the fluid handling structure 12 may be referred to as a surface facing the surface of the substrate W. The distance between the bottom surface and the facing surface may be in the range of 30 to 500 micrometers, desirably in the range of 80 to 200 micrometers.

The fluid handling structure 12 extends closer to the facing surface of the substrate W and substrate support WT than the final element 100. The immersion space 11 is therefore defined between the inner surface of the fluid handling structure 12, the planar surface of the frusto-conical portion and the facing surface. During use, the immersion space 11 is filled with immersion liquid. The immersion liquid fills at least part of a buffer space between the complementary surfaces between the final element 100 and the fluid handling structure 12, in an embodiment at least part of the space between the complementary inner-surface and the conical surface.

The immersion liquid is supplied to the immersion space 11 through an opening formed in a surface of the fluid handling structure 12. The immersion liquid may be supplied through a supply opening 20 in the inner-surface of the fluid handling structure 12. Alternatively or additionally, the immersion liquid is supplied from an under supply opening 23 formed in the bottom surface of the fluid handling structure 12. The under supply opening 23 may surround the path of the radiation beam B and it may be formed of a series of openings in an array or a single slit. The immersion liquid is supplied to fill the immersion space 11 so that flow through the immersion space 11 under the projection system PS is laminar. The supply of the immersion liquid from the under supply opening 23 additionally prevents the ingress of bubbles into the immersion space 11. This supply of the immersion liquid may function as a liquid seal.

The immersion liquid may be recovered from a recovery opening 21 formed in the inner-surface. The recovery of the immersion liquid through the recovery opening 21 may be by application of an under pressure; the recovery through the recovery opening 21 as a consequence of the velocity of the immersion liquid flow through the immersion space 11; or the recovery may be as a consequence of both. The recovery opening 21 may be located on the opposite side of the supply opening 20, when viewed in plan. Additionally or alternatively, the immersion liquid may be recovered through an overflow recovery 24 located on the top surface of the fluid handling structure 12. The supply opening 20 and recovery opening 21 can have their function swapped (i.e. the flow direction of liquid is reversed). This allows the direction of flow to be changed depending upon the relative motion of the fluid handling structure 12 and substrate W.

Additionally or alternatively, immersion liquid may be recovered from under the fluid handling structure 12 through a recovery opening 25 formed in its bottom surface. The recovery opening 25 may serve to hold a meniscus 33 of the immersion liquid to the fluid handling structure 12. The meniscus 33 forms between the fluid handling structure 12 and the facing surface and it serves as border between the liquid space and the gaseous external environment. The recovery opening 25 may be a porous plate which may recover the immersion liquid in a single phase flow. The recovery opening in the bottom surface may be a series of pinning openings 32 through which the immersion liquid is recovered. The pinning openings 32 may recover the immersion liquid in a two phase flow.

Optionally radially outward, with respect to the inner-surface of the fluid handling structure 12, is an gas knife opening 26. Gas may be supplied through the gas knife opening 26 at elevated speed to assist liquid confinement of the immersion liquid in the immersion space 11. The supplied gas may be humidified and it may contain substantially carbon dioxide. Radially outward of the gas knife opening 26 is a gas recovery opening 28 for recovering the gas supplied through the gas knife opening 26.

Further openings, for example open to atmosphere or to a gas source or to a vacuum, may be present in the bottom surface of the fluid handling structure 12, i.e. in the surface of the fluid handling structure 12 facing the substrate W. An example of such an optional further opening 50 is shown in dashed lines on the right hand side of FIG. 2a. As shown, the further opening 50 may be a supply or extraction member, which is indicated by the double-headed arrow. For example, if configured as a supply, the further opening 50 may be connected to a liquid supply or a gas supply as with any of the supply members. Alternatively, if configured as an extraction, the further opening 50 may be used to extract fluid, and may for example, be connected to atmosphere or to a gas source or to a vacuum. For example, the at least one further opening 50 may be present between gas knife opening 26 and gas recovery opening 28, and/or between pinning openings 32 and gas knife opening 26.

The two different versions of the fluid handling structure 12 of the left and right sides of FIG. 2a pin the meniscus 33. The version of the fluid handling structure 12 on the right hand side of FIG. 2a may pin the meniscus 33 at a position that is substantially fixed with respect to the final element 100, due to the fixed position of the pinning opening 32. The version of the fluid handling structure 12 on the left hand side of FIG. 2a may pin the meniscus 33 below the recovery opening 25, and thus the meniscus 33 may move along the length and/or width of the recovery opening 25. For the radiation beam B to be directed to a full side of the substrate W under exposure, the substrate support WT supporting the substrate W is moved relative to the projection system PS. To maximize the output of substrates W exposed by the lithographic apparatus, the substrate support WT (and so substrate W) is moved as fast as possible. However, there is a critical relative speed (often referred to as a critical scan speed) above which the meniscus 33 between the fluid handling structure 12 and the substrate W becomes unstable. An unstable meniscus 33 has a greater risk of losing immersion liquid, for example in the form of one or more droplets.

Furthermore, an unstable meniscus 33 has a greater risk of resulting in the inclusion of gas bubbles in the immersion liquid, especially when the confined immersion liquid crosses the edge of the substrate W.

A droplet present on the surface of the substrate W may apply a thermal load and may be a source of defectivity. The droplet may evaporate leaving a drying stain, it may move transporting contamination such as a particle, it may collide with a larger body of immersion liquid introducing a bubble of gas into the larger body and it may evaporate, applying the thermal heat load to the surface on which it is located. Such a thermal load could be a cause of distortion and/or a source of a positioning error if the surface is associated with positioning of components of the lithographic apparatus relative to the substrate W being imaged. A formation of a droplet on a surface is therefore is undesirable. To avoid formation of such a droplet, the speed of the substrate support WT is thus limited to the critical scan speed at which the meniscus 33 remains stable. This limits the throughput of the lithographic apparatus.

FIG. 2b shows two different versions of the fluid handling structure 12 on its left side and on its right side, which allow movement of the meniscus 33 with respect to the final element 100. The meniscus 33 may move in the direction of the moving substrate W. This decreases the relative speed between the meniscus 33 and the moving substrate W, which may result in improved stability and a reduced risk of breakdown of the meniscus 33. The speed of the substrate W at which the meniscus 33 breaks down is increased so as to allow faster movement of the substrate W under the projection system PS. Throughput is thus increased.

Features shown in FIG. 2b which are common to FIG. 2a share the same reference numbers. The fluid handling structure 12 has an inner surface which complements the conical surface of the frusto-conical shape. The bottom surface of the fluid handling structure 12 is closer to the facing surface than the bottom planar surface of the frusto-conical shape.

Immersion liquid is supplied to the immersion space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B.

Immersion liquid is recovered from the immersion space 11 through recovery openings 25, in the bottom surface of the fluid handling structure 12. As the facing surface moves under the fluid handling structure 12, the meniscus 33 may migrate over the surface of the recovery opening 25 in the same direction as the movement of the facing surface. The recovery openings 25 may be formed of a porous member. The immersion liquid may be recovered in single phase. The immersion liquid may be recovered in a two phase flow. The two phase flow is received in a chamber 35 within the fluid handling structure 12 where it is separated into liquid and gas. The liquid and gas are recovered through separate channels 36, 38 from the chamber 35.

An inner periphery 39 of the bottom surface of fluid handling structure 12 extends into the immersion space 11 away from the inner surface to form a plate 40. The inner periphery 39 forms a small aperture which may be sized to match the shape and size of the radiation beam B. The plate 40 may serve to isolate the immersion liquid at either side of it. The supplied immersion liquid flows inwards towards the aperture, through the inner aperture and then under the plate 40 radially outwardly towards the surrounding the recovery openings 25.

The fluid handling structure 12 may be in two parts as shown on the right hand side of FIG. 2b: an inner part 12a and an outer part 12b. The inner part 12a and the outer part 12b may move relatively to each other, in a plane parallel to facing surface. The inner part 12a may have the supply openings 34 and it may have the overflow recovery 24. The outer part 12b may have the plate 40 and the recovery opening 25. The inner part 12a may have an intermediate recovery 42 for recovering the immersion liquid which flows between the inner part 12a and the outer part 12b.

The two different versions of the fluid handling structure of FIG. 2b thus allow for movement of the meniscus 33 in the same direction as the substrate W, enabling faster scan speeds and increased throughput of the lithographic apparatus. However, the migration speed of meniscus 33 over the surface of the recovery opening 25 in the fluid handling structure 12 of the left side of FIG. 2b may be slow. The fluid handling structure 12 of the right side of FIG. 2b allows for quicker movement of the meniscus 33, by moving the outer part 12b with respect to the inner part 12a and the final element 100. However, it may be difficult to control the intermediate recovery 42 so as to ensure that enough immersion liquid is provided between the inner part 12a and the outer part 12b to prevent contact therebetween.

FIG. 2c shows two different versions of the fluid handling structure 12 on its left side and on its right side, which may be used to pin the meniscus 33 of the immersion liquid to the fluid handling structure 12 as described above in relation to FIGS. 2a and/or 2b. Features shown in FIG. 2c which are common to FIGS. 2a and/or 2b share the same reference numbers.

The fluid handling structure 12 has an inner surface which compliments the conical surface of the frusto-chronical shape. The bottom surface of the fluid handling structure 12 is closer to the facing surface than the bottom planar surface of the frusto-chronical shape. Immersion liquid is supplied to the immersion space 11 delivered through an opening formed in a surface of the fluid handling structure 12. The immersion liquid may be supplied through a supply opening 34 in the inner surface of the fluid structure 12. Alternatively or additionally, the immersion liquid may be supplied through a supply opening 20 in the inner surface of the fluid structure 12. Alternatively or additionally, the immersion liquid is supplied through the under supply opening 23. The immersion liquid may be recovered via an extraction member, for example, via recovery opening 21 formed in the inner-surface and/or overflow recovery 24 and/or one or more openings in a surface of the fluid handling structure 12 as described below.

The two different versions of the fluid handling structure 12 of the left and right sides of FIG. 2c pin the meniscus 33. The version of the fluid handling structure 12 on the right hand side of FIG. 2c may pin the meniscus 33 at a position that is substantially fixed with respect to the final element 100, due to the fixed position of the recovery opening 32a. The version of the fluid handling structure 12 on the left hand side of FIG. 2c may pin the meniscus 33 below the recovery opening 25, and thus the meniscus 33 may move along the length and/or width of the recovery opening 25.

As described above in relation to FIG. 2b, an inner periphery of the bottom surface of fluid handling structure 12 may extends into the immersion space 11 away from the inner surface to form a plate 40 as shown on the left hand side. As described above, this may form a small aperture, and may isolate the immersion liquid at either side and/or cause immersion liquid to flow inwards towards the aperture, through the inner aperture and then under the plate 40 radially outwardly towards the surrounding the recovery openings 25. Although this features is shown on the left hand side in FIG. 2c, it is optional in combination with the other features shown. Preferably, as shown on the left hand side, immersion liquid is supplied to the immersion space 11 through supply openings 34 formed in the inner surface of the fluid handling structure 12. The supply openings 34 are located towards the bottom of the inner surface, perhaps below the bottom surface of the frusto-conical shape. The supply openings 34 are located around the inner surface, spaced apart around the path of the radiation beam B. Alternatively or additionally, the immersion liquid may be supplied through a supply opening 20 in the inner surface of the fluid structure 12. Alternatively or additionally, the immersion liquid is supplied through the under supply opening 23. Although the supply openings 34 are the preferred liquid supply, any combination of supply openings 34, supply openings 20 and/or under supply openings 23 may be provided.

As shown on the left hand side of FIG. 2c, a fluid handling system may comprise the fluid handling structure 12 as described above and a third device 300. The fluid handling structure 12 may have an extraction member, such as recovery opening 25, and a liquid supply opening, such as the under supply opening 23. It will be understood that the fluid handling structure 12 may comprise any configuration as disclosed in relation to the left hand of FIG. 2a, the right hand side of FIG. 2a, the left hand side of FIG. 2b, the right hand side of FIG. 2b or (as described below) the right hand side of FIG. 2c, in combination with the third device 300.

The third device 300 may otherwise be referred to as a droplet catcher. The third device 300 is provided to reduce occurrence of liquid on the surface of the substrate W after the fluid handling structure 12 has moved over the surface. The third device 300 may comprise a liquid supply member 301 and at least one extraction member 302. The at least one extraction member 302 may be formed in a shape surrounding the at least one supply member 301 in plan. The at least one third liquid supply member 301 may be configured to provide a third liquid to a space 311 between at least a part of the third device 300 and the surface of the substrate W. The third device 300 may be configured to recover at least some of the liquid via the at least one extraction member 302. The third device 300 may be used to incorporate any liquid left on the surface of the substrate W with the liquid in the third space 311 and then use the third device 300 to extract the liquid such that the amount of liquid remaining on the surface of the substrate W is reduced.

The third device 300 is shown as a separate device from the fluid handling structure 12 in FIG. 2c. The third device 300 may be positioned adjacent to the fluid handling structure 12. Alternatively, the third device 300 may be part of, i.e. integral to, the fluid handling structure 12.

The third device 300 may be configured to provide a liquid to a third space 311 which is separate from the liquid provided by the fluid handling structure 12.

Additionally or alternatively, the fluid handling structure 12 may have the components as shown on the right hand side of FIG. 2c. More specifically, the fluid handling structure 12 may comprise the at least one liquid supply member, two extraction members (e.g., recovery openings 32a and 32b) and two gas supply members (e.g., gas supply openings 27a and 27b) formed on the surface of the fluid handling structure 12. The at least one liquid supply member may be the same as the under supply opening 23 in the bottom surface of the fluid handling structure 12 described above or the supply opening 20 or liquid supply openings 34 formed on the inner surface of the fluid handling structure 12 described in relation to left hand side of FIG. 2b. The liquid supply member, the extraction members and the gas supply members may be formed on the surface of the fluid handling structure 12. Specifically, these components may be formed on a surface of the fluid handling structure 12 facing the substrate W, i.e. the bottom surface of the fluid handling structure 12.

At least one of the two extraction members may comprise a porous material 37 therein. The porous material 37 may be provided within an opening, e.g., recovery opening 32a through which fluid handling structure 12 extracts fluid from below the fluid handling structure 12 and may recover the immersion liquid in a single phase flow. The other of the two extraction members, e.g., recovery opening 32b may recover the immersion fluid as a dual phase extractor.

Specifically, the fluid handling structure 12 may comprise the liquid supply member (e.g., under supply opening 23), with a first extraction member (e.g., recovery opening 32a) radially outwards of the liquid supply member, and a first gas supply member (e.g., gas supply opening 27a) radially outwards of the first extraction member, and the second extraction member (e.g., recovery opening 32b) radially outwards of the first gas supply member, and a second gas supply member (e.g., gas supply opening 27b) radially outwards of the second extraction member. Similar to FIG. 2a, further openings, for example open to atmosphere or to a gas source or to a vacuum, may be present in the bottom surface of the fluid handling structure 12 as described previously (in relation to the fluid handling structure 12).

For example, at least one further opening (not shown) may be provided in the bottom surface of the fluid handling structure 12. The further opening is optional. The further opening may be arranged between the first extraction member (e.g., recovery opening 32a) and the first gas supply member (e.g., gas supply opening 27a) as described in the arrangement above. Alternatively or additionally, the further opening may be arranged between the second extraction member (e.g., recovery opening 32b) and the second gas supply member (e.g., gas supply opening 27b) as described in the arrangement above. The further opening may be the same as further opening 50 described above.

Optionally, the fluid handling structure 12 comprises a recess 29. The recess 29 may be provided between the recovery opening 32a and recovery opening 32b or gas supply opening 27a and recovery opening 32b. The shape of the recess 29 may be uniform around the fluid handling structure 12 and may optionally contain an inclined surface. In the case of the recess 29 provided between the recovery opening 32a and recovery opening 32b, the gas supply opening 27b may be provided on the inclined surface as shown in FIG. 2c. In the case of the recess 29 provided between the supply opening 27a and recovery opening 32b, the gas supply opening 27b may be provided on the inclined surface or a part of the bottom surface of the fluid handling structure 12 which is parallel to the surface of the substrate W. Alternatively, the shape of the recess 29 may vary around the circumference of the fluid handling structure 12. The shape of the recess 29 may be varied to alter the impact of gas supplied from the gas supply members on the fluid below the fluid handling structure 12.

FIGS. 2a-2c show examples of different configurations which can be used as part of a fluid handling system. It will be understood that the examples provided above refer to specific extraction members and recovery members, but it is not necessary to use the exact type of extraction member and/or recovery member. In some cases different terminology is used to indicate the position of the member, but the same functional features may be provided. Examples of the extraction member referred to above include recovery opening 21, overflow recover 24, recovery opening 25 (possibly comprising a porous plate and/or the chamber 35), gas recovery opening 28, pinning opening 32, recovery opening 32a, recovery opening 32b and/or the intermediate recovery 42. Examples of the supply member referred to above include supply opening 20, under supply opening 23, gas knife opening 26, gas supply opening 27a, gas supply opening 27b, and/or supply openings 34. In general, an extraction member used to extract/recover fluid, liquid or gas is interchangeable with at least any of the other examples used which extract/recover fluid, liquid or gas respectively. Similarly, a supply member used to supply fluid, liquid or gas is interchangeable with at least any of the other examples used which supply fluid, liquid or gas respectively. The extraction member may extract/recover fluid, liquid or gas from a space by being connected to an under pressure which draws the fluid, liquid or gas into the extraction member. The supply member may supply fluid, liquid or gas to the space by being connected to a relevant supply.

Although the above described fluid handling structure 12 of FIGS. 2a, 2b and 2c provides measures to remove the immersion liquid from the surface of the substrate W, leakage of the immersion fluid may still occur and/or there may be limitations on the critical relative speed. As described, various defects can occur from liquid droplets on the surface of the substrate W and particularly small droplets will lead to watermark defects which reduces yield.

More specifically, the droplet may evaporate leaving a drying stain, it may move transporting contamination such as a particle, it may collide with a larger body of immersion liquid introducing a bubble of gas into the larger body and it may evaporate, applying the thermal heat load to the surface on which it is located. Such a thermal load could be a cause of distortion and/or a source of a positioning error if the surface is associated with positioning of components of the lithographic apparatus relative to the substrate W being imaged. Compounds from a resist surface on the substrate W may leak into a droplet, and the leaked compounds may be concentrated as the droplet evaporates to form solid residues. When the concentration reaches saturation, solid residues may form on the surface of the substrate. Both the solid residues and the compound can diffuse into the resist layer and can destroy the irradiated region by forming a watermark defect. For at least these reasons, droplets on the surface of the substrate W are undesirable. More particularly, small to medium droplets may be of particular concern because the size leads to evaporation of the droplet which is known to lead to the detrimental effects referred to above. Furthermore, it is noted that as advancements are made, additional layers may be patterned on a single substrate, thus increasing the possibility of such defects occurring on any single substrate W.

To prevent or reduce water loss, and thus formation of such droplets, the speed of the substrate support WT can be limited to the critical scan speed at which the meniscus 33 remains stable. This limits the throughput of the lithographic apparatus because the substrates W are generated at a slower rate. The systems described above also have recovery mechanisms in place, such as gas knife opening 26 to remove liquid from the surface of the substrate W in order to remove the immersion liquid to reduce droplets being left behind. It has been found that drying the substrate W by removing all the liquid after irradiation with an immersion system, for example by using the fluid handling structure 12 as described in relation to FIGS. 2a and/or 2b and/or 2c can reduce the incidence of droplets on the surface of the substrate W after immersion. However, some droplets may still be formed, and the limit on the critical scan speed would ideally be higher if possible.

The inventors of the present invention have realised that instead of keeping the substrate as dry as possible after exposure using an immersion liquid, that wetting the substrate W provides an alternative way of addressing watermark defects. Advantageously, wetting the substrate W can reduce or prevent the above described watermark defects, and thus increase yield. Additionally, watermark defects may no longer be dependent on other post-exposure steps. Also, wetting the substrate W is generally much easier than drying it. Drying the substrate W requires specific control in a tightly controlled time gap, whereas wetting a substrate W is simpler and takes less time.

Wetting the substrate W may be realised in various ways as will be described below. Embodiments of the present invention will be described with reference to FIGS. 3a, 3b, 3c, 4a, 4b, 4c and 4d which show a part of an apparatus in cross section. The same reference numerals are used for features in these figures which are common to FIGS. 2a, 2b and 2c. Features already described in relation to FIGS. 2a, 2b and 2c are not described further, but any of the features described in relation to FIGS. 2a, 2b and 2c can be combined with the features shown in FIGS. 3a, 3b, 3c, 4a, 4b, 4c and 4d.

The present embodiment provides a fluid handling system for wetting a region of a surface of the substrate W. Additionally, an embodiment provides a method for wetting the region of the surface of the substrate W as described herein. The region may be the same as at least one target portion C as described above.

The fluid handling system comprises a first device 112 and a second device 200. As described in further detail below, the first device 112 is configured to provide a first liquid to the substrate W, and the second device 200 is configured to provide a second liquid to the substrate W. The first liquid and the second liquid are provided such that the first liquid and the second liquid are separate from each other on the surface of the substrate W.

The method comprises providing a first liquid to a first space 111. The first liquid may be provided to the first space 111 using the first device 112. The first device 112 may be the fluid handling structure 12 as described in any of the embodiments and/or variations above, for example as shown and/or described in relation to the left hand side and/or right hand side of the FIGS. 2a and/or 2b and/or 2c.

The first device 112 is configured to confine the first liquid to the first space 111. The first device 112 has the aperture 10 formed therein for the passage therethrough of radiation beam B to irradiate the region of the substrate W. The aperture 10 defines the first space 111 to be filled with the first liquid. The first device 112 comprising at least one first liquid supply member to provide the first liquid to the first space 111. The at least one first liquid supply member may be the supply opening 20, supply opening 34 and/or the underside openings 23 as described above.

The first space 111 may be between at least a part of the first device 112 and the surface of the substrate W. Thus, the first space 111 may be the same as the immersion space 11 described above. The first liquid in the first space 111 may be formed on a first area of the surface of the substrate W, i.e. the first area may be the area of the surface of the substrate W in contact with the first liquid. The first area of the substrate W in contact with the first liquid will move if the substrate is moved relative to the first device 112 (or vice versa). When the liquid layer is formed by the second liquid, the second area may be larger than the first area.

As described, the first space 111 may be between the final element 100 and a surface facing the final element 100. The facing surface is a surface of substrate W or a surface of the supporting stage (or substrate support WT) that is co-planar with the surface of the substrate W. (Please note that reference in the following text to surface of the substrate W also refers in addition or in the alternative to the surface of the substrate support WT, unless expressly stated otherwise; and vice versa).

The first space 111 may be defined by the first device 112 and the substrate W. Thus, as in the above variations, the first space 111 may be formed by the first device 112 above substrate W. The first space 111 may be further defined by the last element 100 of the projection system PS. The first space 111 may be filled with the first liquid. The liquid may be confined to the first space 111 as described above in relation to the fluid handling structure 12. Specifically, the first liquid (i.e. immersion liquid) can be provided by at least one liquid supply member to the space between the final element 100 and the first device 112 and the substrate W. The first liquid can be confined as previously described by controlling the supply of liquid and by using at least one extraction member to remove the first liquid from the space. Thus, the first liquid can be confined to the first space 111. The at least one liquid supply member may be any appropriate supply member capable of supplying liquid, for example under supply opening 23. The at least one extraction member may be any member capable of extracting liquid, for example, pinning opening 32.

The first device 112 has an aperture 10 formed therein for the passage therethrough of the radiation beam B through the first liquid to irradiate the region of the surface of the substrate W. The region of the substrate W which is irradiated will be within the first area during irradiation of that region.

The method may include irradiating the region of the substrate W by passing the radiation beam B through the aperture 10 of the first device 112 and through the first liquid in the first space 111. Thus, when the substrate W is being patterned, the radiation beam B may pass from the final element 100 through the aperture 10 filled with the first liquid to irradiate the region of the substrate W below the final element 100.

The second liquid is provided by the second device 200. More specifically, the second device 200 comprises at least one second liquid supply member 201 configured to provide the second liquid. The method further comprises providing a second liquid to a second space 211. The second space 211 may be formed between the second device 200 providing the second liquid and a surface facing second the device 200. The facing surface is a surface of substrate W or a surface of the supporting stage (or substrate support WT) that is co-planar with the surface of the substrate W. (Please note that reference in the following text to surface of the substrate W also refers in addition or in the alternative to the surface of the substrate support WT, unless expressly stated otherwise; and vice versa).

The second liquid in the second space 211 may be formed on a second area of the surface of the substrate W, i.e. the second area may be the area of the surface of the substrate W in contact with the second liquid. The second area of the substrate W in contact with the second liquid will move if the substrate W is moved relative to the second device 200 (or vice versa). As more of the second liquid is provided to the second space 211, the liquid will spread out over the surface of the substrate W and the size of the second area will increase.

The second space 211 may be filled with a second liquid. However, the entire space between the second device 200 and the substrate W may not necessarily be completely filled with liquid. For example, the second liquid may be provided on the surface of the substrate W in the second space 211 without touching the base of the second device 200. For example, the second liquid may be provided to the second space 211 by spraying the second liquid on the surface of the substrate W.

The second liquid and the first liquid are separate from each other on the surface of the substrate W. In other words, there is a gap g between the first liquid in the first space 111 and the second liquid in the second space 211. The gap g is formed on the surface of the substrate W. This means that the first liquid and the second liquid are not in direct contact with each other. Thus, the second area of the surface of the substrate W on which second liquid is provided and the first area of the surface of the substrate W on which the first liquid is provided are separate from each other.

The second liquid is provided to form a liquid layer on the surface of the substrate W. More specifically, the second liquid is provided to the second space 211 without removing any liquid from the second space 211 to form the liquid layer on the irradiated region of the substrate W. The second liquid may be provided to the second space 211 at any appropriate rate. For example, the second liquid may be provided at the same or a similar rate to any other liquid supply described above and/or known in the art. It will be understood that this may vary, for example, depending on the relative speed between the fluid handling system and the substrate W. Generally, liquid may be provided to the second space 211 at a rate of approximately 0.05-0.5 litres per minute, or preferably 0.1-0.3 litres per minute. Preferably, the rate of liquid provided to the second space 211 may be approximately 0.2 litres per minute. A liquid layer is formed on the irradiated region of the substrate W due to an increase in the amount of second liquid provided to the second space 211 over time. In this way, the second device 200 is used to wet the region of the substrate W, and more particularly, to wet the irradiated region of the substrate W.

The fluid handling system is configured to provide the first liquid and the second liquid on the surface of the substrate simultaneously. This means that the first device 112 and the second device 200 are configured to provide liquid at the same time. The substrate W may be moved relative to the fluid handling system (or vice versa). Thus, when there is relative movement, at a particular point (e.g. a region to be irradiated), the region is covered by the first liquid, then irradiated, then the first liquid is moved relative to the irradiated region and the region starts to dry, causing problems as discussed. The second liquid can then be provided to wet the region. Providing the liquid simultaneously means that the second liquid can very quickly be provided to any particular point as soon as the first liquid is removed.

The second liquid is used to form a layer of liquid, the liquid layer being larger than any small droplets which might be left behind when the substrate W is moved relative to the first device 112. The liquid layer does not evaporate and damage the substrate W in the same way as smaller droplets. Even if the liquid layer breaks up to form large droplets of liquid, these larger droplets do not evaporate and cause damage in the same way as the smaller droplets described above.

An advantage of the liquid layer is that droplets left on the surface can be incorporated into the liquid layer before they damage the surface of the substrate W. For example, any droplets of the first liquid which have separated from the first space 111 and which are left of the surface of the substrate W can be incorporated into the liquid layer. This can reduce the occurrence of watermark defects.

Wetting the irradiated region of the substrate W in this way may be quicker than drying the surface of the substrate W using known techniques. Thus, the present method may be more effective in reducing or avoiding watermark related defects. Additionally, the control used to supply the second liquid to the surface of the substrate W may be less demanding than the control needed for a drying unit used to dry the surface rather than wet the surface.

The second device 200 may be part or, or positioned adjacent to, the first device 112. The second device 200 may be located in other locations. For example, the second device 200 may be positioned at the edge of any liquid on the surface of the substrate W which the second device 200, i.e. where the second device 200 can be used to wet the surface of the substrate W which would otherwise dry out and potentially have watermark issues. The second device 200 may be fixed and may be provided in any part of a substrate track. The second device 200 may be provided in any location in which the second liquid can be provided to the surface of the substrate W after irradiation.

As described, no liquid is removed from the second space 211 and the liquid layer is formed over the substrate W, and particularly over the irradiated parts of the surface of the substrate W after the relevant region(s) have passed under the first device 112. The second device 200 may not comprise any mechanisms for the removal of liquid. Thus, the second device 200 may be used to supply the second liquid to the second space 211 without removing any liquid.

The liquid layer formed on the substrate W has a thickness t as shown in FIGS. 3a, 3b, 3c, 4a, 4b, 4c and 4d. Preferably, the liquid layer has a thickness of at least approximately 10 μm, or preferably at least approximately 20 μm, or more preferably at least approximately 30 μm. The thickness t may be approximately the same as the distance between a bottom surface of the second device 200 and the facing surface. This distance may be approximately the same as the distance between the first device 112 and the facing surface. The distance between the bottom of the first device 112 and the facing surface may be in the range of 30 to 500 micrometers, desirably in the range of 80 to 200 micrometers, which may therefore also be the thickness t of the liquid layer. After the second device 200 has been moved with respect to an irradiated wetted region, the liquid layer on the surface of the substrate W may break up into droplets. Due to the increased amount of liquid, these droplets will generally be relatively large and thus, will still reduce the issues discussed above. Thus, the thickness t may then average thickness of multiple large droplets formed on the surface of the substrate W. The thickness t may be the average of all of the large droplets, and the layer before breaking up into droplets, i.e. an average thickness of all the second liquid on the surface of the substrate W provided by the second device 200.

The method may further comprise moving the substrate W relative to the fluid handling system. Specifically, the substrate W may be moved and the fluid handling system may be in a fixed position. However, this is not a requirement, and the fluid handling system could be moved whilst the substrate W is in a fixed position, or both the fluid handling system and the substrate W could be moved to provide relative movement.

The substrate W may be moved relative to the fluid handling system such that the second space 211 is positioned over at least the irradiated region of the substrate W after irradiation by the radiation beam B. Thus, the second area (i.e. the area of the substrate in contact with the second liquid) will vary as there is relative movement between the substrate W and the fluid handling system. The first space 111 may be positioned over the region (which may be one of the target portions C described above). At this time, the region is part of the first area. The region may be irradiated by passing the radiation beam B through the first liquid in the first space 111 to the region. After irradiation the substrate W may be moved relative to the fluid handling system such that the second liquid is positioned over the irradiated region. Thus, after irradiation, the irradiated region is part of the second area. In this way, the second fluid can be provided to form a liquid layer of the parts of the substrate W which have been irradiated.

Ideally, the irradiated region is wetted shortly after irradiation. In particular, after the region has been irradiated, the substrate W will likely be moved so that the first device 112 is positioned over a different part of the surface of the substrate W to irradiate the next part (which may be another one of the target portions C described above). When the first device 112 is moved to the different part of the substrate W, the first liquid in the first space 111 moves to the other part of the substrate W. As described, this may leave behind droplets on the surface of the substrate W, and particularly over the irradiated region of the substrate W. The second liquid in the second space 211 can be provided over the irradiated region to incorporate the droplets left behind on the surface and limit the detrimental effects of the droplets. Generally, the quicker this is done, the less effect the droplets on the surface will have to the substrate W.

Thus, it is beneficial for the second liquid to be moved over the region (i.e. the irradiated region) of the substrate W within a specific period of time of the first liquid being removed from the region. If the second device 200 is in a fixed position relative to the first device 112, the time gap between the first and second liquid over a particular point will depend on the relative speed between the substrate W and the fluid handling system. Preferably, the second liquid is moved over the region in less than approximately 20 seconds, or preferably in less than approximately 15 seconds, or preferably in less than approximately 10 seconds, or preferably in less than approximately 5 seconds. Preferably, the second liquid is moved over the irradiated region in less than approximately 2 seconds. Preferably, the fluid handling system is configured to provide the second liquid over the irradiated region in the above described time. The time may be determined from when the meniscus 33 at the edge of the first space 111 is moved from over the region until the edge of the second liquid is over the region.

As described above, the first space 111 and the second space 211 are separate spaces. In other words, the liquid of the first space 111 and the second space 211 are not joined. Thus, the gap g is provided between the first liquid of the first space 111 and the second liquid of the second space 211. The gap g may be formed due to the distance between the first liquid supply member (for example 20, 23 or 34) and the at least one second liquid supply member 201. The gap g may be maintained by any combination of extraction members used to remove fluid between the first liquid in the first space 111 and the second liquid in the second space 211.

As described, the second liquid is not removed from the second space 211. Thus, the second liquid in the second space 211 will spread out over time and will not be removed by the second device 200 being used to provide the second liquid. However, it is noted that the liquid layer is preferably used after irradiation of the region of the substrate W. Thus, the second space 211 is preferably formed at a trailing edge of the first device 112. In other words, a substrate W may be moved under the first device 112 and is irradiated and then moved under the second device 200 to be wetted so that droplets of first liquid leftover from the first space 111 can be incorporated into the second space 211. This is shown in each of the FIGS. 3a-4d.

It will be understood that the second device 200 could be provided around the whole of the first device 112. Alternatively, the second device 200 may only be provided at a part of the first device 112. The second device 200 may be controlled to only provide liquid on the trailing side of the first device 112 (or may be positioned at a trailing edge). Thus, the second liquid may only be provided to the second space 211 after the region is irradiated. In this way, the gap g may be maintained due to the relative movement between the substrate W and the second device 200, and/or due to any extraction member(s) use to recover/extract the first liquid.

When the at least one second liquid supply member 201 is provided at the trailing edge, the substrate W may be moved relative to the first device 112 and second device 200 as shown in the arrows in FIGS. 3a, 3b, 3c, 4a, 4b, 4c and 4d. For example, when the substrate W is moved along arrow A, the at least one second liquid supply member 201 as shown in the right hand side of any of these figures is on the trailing side, and thus, may be used to provide the second liquid in the second space 211 which is separate from the first space 111. When the substrate W is moved along arrow B, the at least one second liquid supply member 201 as shown in the left hand side of any of these figures is on the trailing side, and thus, may be used to provide the second liquid in the second space 211 which is separate from the first space 111. The at least one second liquid supply member 201 may only be configured to provide the second liquid when on the trailing side of the first device 112. The at least one second liquid supply member 201 may be configured to provide the second liquid when the substrate W is being moved relative to the second device 200 as shown in FIGS. 3a, 3b, 3c, 4a, 4b, 4c and 4d.

Preferably, the first liquid and/or the second liquid is water. The water may be distilled water of high purity, such as Ultra-Pure Water (UPW) which is commonly used in semiconductor fabrication plants. The UPW may be purified and it may undergo additional treatment steps before supply to the first space 111 and/or second space 211. Other liquids with a high refractive index can be used besides water, for example: a hydrocarbon, such as a fluorohydrocarbon; and/or an aqueous solution. The second liquid may be the same as the first liquid, or may be different. The second liquid is provided to prevent (or at least reduce) occurrence of droplets drying on the surface of the substrate W. Thus, the refractive index of the second liquid is of no importance.

The at least one second liquid supply member 201 may comprise at least one spray nozzle. The at least one second liquid supply member 201 may be formed by at least one opening, or multiple openings, or more specifically, a series of openings in an array. The second liquid supply member 201 may comprises a plurality of nozzles, and more particularly a series of spray nozzles. Thus, the second liquid supply member 201 may be formed from multiple outlets used to spray the second liquid into the second space 211.

The first device 112 of the fluid handling system may have any appropriate configuration, for example, as described in any of the variations of fluid handling structure 12 above. Specifically, the second device 200 may be provided in combination with the fluid handling structure 12 of any one of FIGS. 2a, 2b, and/or 2c as the first device 12. This is shown in FIGS. 3a-4d. In FIGS. 3a, 3b and 3c, the second device 200 is provided in addition to the first device 112 which is separate from the second device and which includes the features described above in relation to FIGS. 2a, 2b and 2c.

More specifically, the fluid handling system may comprise the third device 300. The fluid handling system comprising the third device 300 may additionally comprise the first device 112 with features as described in relation to the fluid handling structure 12 of any of FIG. 2a, 2b or 2c. Specifically, the first device 112 may have the features described in relation to the fluid handling structure 12 on the left hand side of FIG. 2c. The third device 300 may comprise the at least one third liquid supply member 301 and the at least one extraction member 302 as described in relation to the left hand side of FIG. 2c. The third device 300 is shown in FIG. 3c as being separate from both the first device 112 and the second device 200. As shown in FIG. 3c, the third device 300 may be positioned adjacent to the first device 112. As shown in FIG. 3c, the third device 300 may be positioned adjacent to the second device 200. The third device 300 may be connected to, i.e. part of, the first device 112, the second device 200, or both the first device 112 and the second device 200 as shown in FIG. 4d.

Additionally or alternatively, the first device 112 may be configured as described in relation to the right hand side of FIG. 2c. Thus, the first device 112 may comprise at least liquid supply member (e.g., under supply opening 23 or supply opening 20, 34), two extraction members (i.e., recovery openings 32a, 32b) and the at least two gas supply members (e.g., gas supply openings 27a, 27b). The at least one liquid supply member, the two extraction members and the two gas supply members may be formed on a surface of the first device 112 facing the surface of the substrate W. This means that the extraction members and gas and/or liquid supply members may each have an opening formed on the surface of the first device 112 facing the substrate W (i.e. the bottom surface of the first device 112). Thus, the extraction members can extract fluid from a space between the first device 112 and the substrate W. The gas and/or liquid supply members can supply fluid to a space between the first device 112 and the substrate W.

As shown on the right hand side of FIG. 3c, at least one of the two extraction members, e.g., recovery opening 32a may comprise a porous material 37 therein and recover the immersion fluid in a single phase flow. The other of the two extraction members, e.g., recovery opening 32b may recover the immersion fluid as a dual phase extractor. Similarly, further openings, for example open to atmosphere or to a gas source or to a vacuum, may be present in the bottom surface of the first device 112 as described previously (in relation to the first device 112 and/or the fluid handling structure 12). Additionally or alternatively, as described in relation to FIG. 2c, the surface of the first device 112 facing the substrate W may comprise the recess 29.

Alternatively, the first device 112 may be configured as described in relation to FIG. 2a. More specifically, the first device 112 may comprise at least two extraction members (e.g. recovery opening 21, gas recovery opening 28, pinning openings 32 and/or recovery opening 25) and at least one fluid supply member (e.g. gas knife opening 26). The liquid supply member (e.g., under supply opening 23 or supply opening 20, 34), the at least two extraction members and the gas supply member may be formed on the surface of the first device 112 facing the surface of the substrate W or the final element 100. In plan, a first one of the at least two extraction members (e.g., gas recovery opening 28) may be radially outwards of the gas supply member (e.g., gas knife opening 26). Thus, the first one of the at least two extraction members may be outwards of the gas supply member with respect to the central point of the first device 112. The central point of the first device 112 may be the point through which the radiation beam is passed. Preferably, the gas supply member is radially outwards of a second one of the at least two extraction members, i.e., pinning opening 32. Preferably, the second one of the at least one extraction members is radially outwards of the liquid supply member (e.g., under supply opening 23). At least one of the at least two extraction members (e.g., recovery opening 21 and/or pinning opening 32) may recover the immersion fluid as a dual phase extractor. This configuration is shown on the left hand side and the right hand side of FIG. 3a.

At least one of the at least two extraction members may comprise a porous material therein and recover the immersion fluid in a single phase flow. The porous material may be provided in the extraction member which is most radially inwards. For example, the first one of the extraction members (e.g., recovery opening 25) may be formed as a porous plate as described above, and as shown on the left hand side of FIG. 3a.

Additionally or alternatively, the first device 112 may be configured as described in relation to FIG. 2b. More specifically, the at least one extraction member of the first device 112 may comprise the chamber 35 in a surface of the first device 112 facing the surface of the substrate W, as shown on the left hand side of FIG. 3b. A porous material may form recovery opening 25 at an edge of the chamber 35. The porous material may form the edge of the chamber 35 on the surface of the first device 112 facing the substrate W. The extraction member may comprise first channel 36 configured to extract liquid from the chamber 35 and second channel 38 configured to extract gas from the chamber 35.

Additionally or alternatively, the first device 112 may be configured as described in relation to the right hand side of the fluid handling structure 12 of FIG. 2b. More specifically, the first device 112 may comprise the inner part 112a and the outer part 112b as shown in FIG. 3b. The at least one liquid supply member (e.g. supply opening 34) of the first device 112 may be formed on the inner part 12a. The inner part 12a may comprise the first extraction member (e.g. the intermediate recovery 42) and the outer part may comprise the second extraction member (e.g. recovery opening 25). As described, the outer part 112b and the inner part 112a may be moved relative to each other.

The outer part 112b may comprise the plate 40 positioned between the inner part 112a and the substrate W. The plate 40 may be configured to isolate the first liquid on either side of the plate 40. A surface of the inner part 112a facing the plate 40 may comprise the first extraction member (e.g. the intermediate recovery 42). A surface of the plate 40 facing the substrate W may comprise the second extraction member (e.g. recovery opening 25). The first extraction member and/or the second extraction member may comprise a porous material configured to recover liquid in a single phase flow. FIG. 3b shows that both the first extraction member and the second extraction member comprise the porous material, however, this is not necessary, and only one or neither of the extraction members may comprise porous material.

The second device 200 is shown as a separate entity, i.e. not directly connected to, the first device 112 in FIGS. 3a, 3b and 3c. The second device 200 could be in a fixed position relative to other components of the fluid handling system, such as the first device 112. Alternatively, the second device 200 could be moved relative to other components of the fluid handling system, such as the first device 112. As shown in FIGS. 3a, 3b and 3c, the second device 200 may be positioned adjacent to the first device 112. Thus, the second device 200 may be next to the first device 112 without other components between the first device 112 and the second device 200.

Alternatively, the second device 200 may be connected to, or part of, the first device 112, as shown in FIGS. 4a, 4b, 4c and 4d. The first device 112 of FIGS. 4a, 4b, 4c and 4d include the features described above in relation to FIGS. 2a, 2b and 2c (and FIGS. 3a, 3b and 3c).

FIGS. 3a, 3b, 3c, 4a, 4b, 4c and 4d are intended to provide variations shown in FIGS. 2a, 2b and 2c with the addition of the second device 200 comprising at least one second supply member 201. The second device 200 could be provided in combination with various other liquid supply and liquid removal members, as long as the second device 200 is configured to form a liquid layer, i.e. is configured to provide second liquid to the second space 211 without removing any liquid from the second space 211. In other words, the fluid handling system comprises the first device 112 as described in any of the variations or embodiments described above, in combination with the second device 200 in any of the variations or embodiments described above, optionally, in combination with any other components or mechanisms such as the third device 300.

The present invention may provide a lithographic apparatus. The lithographic apparatus may have any/all of the other features or components of the lithographic apparatus as described above. For example, the lithographic apparatus may optionally comprise at least one or more of a source SO, an illumination system IL, a projection system PS, a substrate table WT, etc.

Specifically, the lithographic apparatus may comprise the projection system configured to project the radiation beam towards the region of the surface of a substrate W. The lithographic apparatus may further comprise the fluid handling system as described in any of the above embodiments and variations.

The lithographic apparatus may comprise a mechanism configured to move the substrate W relative to the fluid handling system to position the at least one second liquid supply member 201 to provide the second liquid over the irradiated region of the substrate W after irradiation by the radiation beam. Thus, the mechanism may be used to control the position of the substrate W (or alternatively, the position of the fluid handling system). The mechanism could be, or could comprise, the substrate support (e.g., a substrate table) WT constructed to hold the substrate W and/or the second positioner PW configured to accurately position the substrate support WT.

Embodiments are provided according to the following clauses:
1. A fluid handling system for wetting a region of a surface of a substrate irradiated by a radiation beam, the fluid handling system comprising:
   a first device configured to confine a first liquid to a first space between at least a part of the first device and the surface of the substrate, the first device having an aperture formed therein for the passage therethrough of the radiation beam to irradiate the region by passing through the first liquid, the first device comprising at least one first liquid supply member configured to provide the first liquid to the first space and at least one extraction member configured to remove liquid from the first space; and a second device comprising at least one second liquid supply member configured to provide a second liquid to a second space between at least a part of the second device and the surface of the substrate, wherein there is a gap on the surface of the substrate between the second liquid and the first liquid, wherein the fluid handling system is configured to provide the second liquid to the second space without removing any liquid from the second space to form a liquid layer over at least the region, and is configured to provide the first liquid and the second liquid on the surface of the substrate simultaneously.

2. The fluid handling system of clause 1, wherein the at least one second liquid supply member comprises a series of spray nozzles, and/or further comprising a third device comprising at least one third liquid supply member and at least one extraction member, the at least one third liquid supply member being configured to provide a third liquid to a third space between at least a part of the third device and the surface of the substrate, wherein the third device is configured to recover at least some of the third liquid via the at least one extraction member.

3. The fluid handling system of clause 2, wherein the third device is part of, or positioned adjacent to the first device.

4. The fluid handling system of any of the preceding clauses, wherein the at least one liquid supply member comprises a liquid supply opening formed on an inner surface of the first device and/or on a surface of the first device facing the surface of the substrate.

5. The fluid handling system of any of the preceding clauses, wherein the first device comprises two extraction members and two gas supply members, wherein the at least one first liquid supply member, the two extraction members and the two gas supply members are formed on a surface of the first device facing the surface of the substrate.

6. The fluid handling system of clause 5, wherein a first one of the extraction members is radially outwards of the first liquid supply member, a first one of the two gas supply members is radially outwards of the first one of the extraction members, the second one of the extraction members is radially outwards of the first one of the two gas supply members, the second of the two gas supply members is radially outwards of the second one of the two extraction members, and/or wherein at least one of the two extraction members comprises a porous material therein, and/or comprising at least one further opening in the bottom surface of the first device, wherein the at least one further opening is arranged between the first one of the two extraction members and the first one of the two gas supply members, and/or between the second one of the two extraction members and the second one of the two gas supply members, and/or wherein the surface of the first device comprises a recess and optionally the recess has an inclined surface.

7. The fluid handling system of any of clauses 1-4, wherein the first device comprises at least two extraction members and at least one gas supply member, wherein the liquid supply member, the at least two extraction members and the gas supply member are formed on a surface of the first device facing the surface of the substrate, or wherein the at least one extraction member of the first device comprises a chamber in a surface of the first device facing the surface of the substrate, and a porous material within the chamber, and the at least one extraction member comprises a first channel configured to extract liquid from the chamber and a second channel configured to extract gas from the chamber, or wherein the first device comprises an inner part and an outer part, wherein the at least one liquid supply member of the first device is formed on the inner part, and wherein the inner part comprises a first extraction member and the outer part comprises a second extraction member.

8. The fluid handling system of clause 7, wherein in plan, a first one of the at least two extraction members is radially outwards of the gas supply member, the gas supply member is radially outwards of a second one of the at least two extraction members, and the second one of the at least one extraction members is radially outwards of the liquid supply member, and/or wherein at least one of the at least two extraction members comprises a porous material therein.

9. The fluid handling system of clause 8, comprising at least one further opening in the bottom surface of the first device, wherein the at least one further opening is arranged between the first one of the two extraction members and the gas supply member, and/or wherein the porous material is provided in the extraction member which is most radially inwards.

10. The fluid handling system of clause 7, wherein the outer part comprises a plate positioned between the inner part and the substrate, the plate being configured to isolate the first liquid on either side of the plate, and wherein a surface of the inner part facing the plate comprises the first extraction member, and a surface of the plate facing the substrate comprises the second extraction member.

11. The fluid handling system of clause 7 or 10, wherein the first extraction member and/or the second extraction member comprises a porous material configured to recover the first liquid in a single phase flow.

12. The fluid handling system of any of the preceding clauses, wherein the second device is part of, or positioned adjacent to, the first device.

13. The fluid handling system of any of the preceding clauses, wherein an area formed by the second liquid on the surface of the substrate is larger than an area formed by the first liquid on the surface of the substrate.

14. The fluid handling system of any of the preceding clauses, wherein the first liquid and/or the second liquid is water, and/or wherein the liquid layer has an average thickness of at least approximately 10 μm, or more preferably, at least approximately 20 μm.

15. A lithographic apparatus comprising:
a projection system configured to project a radiation beam towards the region of the surface of a substrate;
the fluid handling system of any of the preceding clauses; and
a mechanism configured to move the substrate relative to the fluid handling system, or vice versa.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Where the context allows, embodiments of the invention may be implemented in hardware, firmware, software, or any combination thereof. Embodiments of the invention may also be implemented by instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use ambient (non-vacuum) conditions.

Although specific reference may have been made above to the use of embodiments of the invention in the context of optical lithography, it will be appreciated that the invention, where the context allows, is not limited to optical lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A fluid handling system for wetting a region of a surface of a substrate irradiated by a radiation beam, the fluid handling system comprising:
    a first device configured to confine a first liquid to a first space between at least a part of the first device and the surface of the substrate, the first device having an aperture formed therein for the passage therethrough of the radiation beam to irradiate the region by the radiation beam passing through the first liquid, the first device comprising at least one first liquid supply member configured to provide the first liquid to the first space and at least one extraction member configured to remove liquid from the first space; and
    a second device comprising at least one second liquid supply member configured to provide a second liquid to a second space between at least a part of the second device and the surface of the substrate, wherein, when the first and second liquids are provided, there is a gap on the surface of the substrate between the second liquid and the first liquid,
    wherein the fluid handling system is configured to provide the second liquid to the second space without removing any liquid from the second space to form a liquid layer over at least the region, and is configured to provide the first liquid and the second liquid on the surface of the substrate simultaneously.

2. The fluid handling system of claim 1, wherein the at least one second liquid supply member comprises a series of spray nozzles.

3. The fluid handling system of claim 1, wherein the at least one first liquid supply member comprises a liquid supply opening formed on an inner surface of the first device and/or on a surface of the first device facing the surface of the substrate.

4. The fluid handling system of claim 1, wherein the first device comprises at least two extraction members and at least two gas supply members, wherein the at least one first liquid supply member, the at least two extraction members and the at least two gas supply members are formed on a surface of the first device facing the surface of the substrate.

5. The fluid handling system of claim 4, wherein a first one of the at least two extraction members is radially outwards of the first liquid supply member, a first one of the at least two gas supply members is radially outwards of the first one of the at least two extraction members, a second one of the at least two extraction members is radially outwards of the first one of the at least two gas supply members, a second one of the at least two gas supply members is radially outwards of the second one of the at least two extraction members.

6. The fluid handling system of claim 4, further comprising at least one further opening in the surface of the first device facing the surface of the substrate, wherein the at least one further opening is arranged between the first one of the at least two extraction members and the first one of the at least two gas supply members, and/or between the second one of the at least two extraction members and the second one of the at least two gas supply members.

7. The fluid handling system of claim 4, wherein at least one of the at least two extraction members comprises a porous material therein.

8. The fluid handling system of claim 1, wherein the first device comprises at least two extraction members and at least one gas supply member, wherein the at least one first liquid supply member, the at least two extraction members and the at least one gas supply member are formed on a surface of the first device facing the surface of the substrate.

9. The fluid handling system of claim 8, wherein in plan, a first one of the at least two extraction members is radially outwards of the at least one gas supply member, the at least one gas supply member is radially outwards of a second one of the at least two extraction members, and a second one of the at least two extraction members is radially outwards of the at least one liquid supply member.

10. The fluid handling system of claim 9, comprising at least one further opening in the bottom surface of the first device facing the surface of the substrate, wherein the at least one further opening is arranged between the first one of the at least two extraction members and the at least one gas supply member.

11. The fluid handling system of claim 8, wherein the first extraction member and/or the second extraction member comprises a porous material configured to recover the first liquid in a single phase flow.

12. The fluid handling system of claim 8, wherein at least one of the at least two extraction members comprises a porous material therein.

13. The fluid handling system of claim 8, wherein the first device comprises an inner part and an outer part, wherein the at least one liquid supply member of the first device is formed on the inner part, and wherein the inner part comprises a first extraction member of the at least two extraction members and the outer part comprises a second extraction member of the at least two extraction members.

14. The fluid handling system of claim 13, wherein the outer part comprises a plate positioned between the inner part and the substrate, the plate configured to isolate the first liquid on either side of the plate, and wherein a surface of the inner part facing the plate comprises the first extraction member, and a surface of the plate facing the substrate comprises the second extraction member.

15. The fluid handling system of claim 1, wherein the second device is part of, or positioned adjacent to, the first device.

16. The fluid handling system of claim 1, wherein, when the first and second liquids are provided, an area formed by the second liquid on the surface of the substrate is larger than an area formed by the first liquid on the surface of the substrate.

17. A lithographic apparatus comprising:
    a projection system configured to project a radiation beam towards the region of the surface of a substrate;
    the fluid handling system of claim 1; and
    a mechanism configured to move the substrate relative to the fluid handling system, or vice versa.

18. The fluid handling system of claim 1, further comprising a third device comprising at least one third liquid supply member and at least one third device extraction member, the at least one third liquid supply member configured to provide a third liquid to a third space between at least a part of the third device and the surface of the substrate, wherein the third device is configured to recover at least some of the third liquid via the at least one third device extraction member.

19. The fluid handling system of claim 18, wherein the third device is part of, or positioned adjacent to, the first device.

20. The fluid handling system of claim 1, wherein the at least one extraction member of the first device comprises a chamber in a surface of the first device facing the surface of the substrate, and a porous material within the chamber, and the at least one extraction member comprises a first channel configured to extract liquid from the chamber and a second channel configured to extract gas from the chamber.

* * * * *